(12) United States Patent
Terasawa et al.

(10) Patent No.: US 11,624,712 B2
(45) Date of Patent: Apr. 11, 2023

(54) SUBSTRATE DEFECT INSPECTION METHOD AND SUBSTRATE DEFECT INSPECTION APPARATUS

(71) Applicant: SHIN-ETSU CHEMICAL CO., LTD., Tokyo (JP)

(72) Inventors: Tsuneo Terasawa, Joetsu (JP); Yukio Inazuki, Joetsu (JP); Hideo Kaneko, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/406,743

(22) Filed: Aug. 19, 2021

(65) Prior Publication Data

US 2022/0065797 A1   Mar. 3, 2022

(30) Foreign Application Priority Data

Aug. 27, 2020   (JP) .............................. JP2020-143258

(51) Int. Cl.
*G01N 21/95* (2006.01)
*G01N 21/88* (2006.01)
*G01N 21/956* (2006.01)

(52) U.S. Cl.
CPC ..... *G01N 21/9501* (2013.01); *G01N 21/8806* (2013.01); *G01N 21/956* (2013.01)

(58) Field of Classification Search
CPC .......... G01N 21/9501; G01N 21/8806; G01N 21/956; G01N 2021/8822; G01N 21/8851; G03F 1/24; G03F 1/84; H01L 22/12
See application file for complete search history.

(56) References Cited

U.S. PATENT DOCUMENTS 6,618,134 B2 * 9/2003 Vaez-Iravani ............. G01J 3/44
                                                        356/237.4
8,411,264 B2 * 4/2013 Ueno ................. G01N 21/9501
                                                        356/237.4
(Continued)

FOREIGN PATENT DOCUMENTS

JP    2010-272553 A    12/2010
JP    4822103 B2       11/2011
(Continued)

OTHER PUBLICATIONS

Yamane, Takeshi et al., "Performance in Practical Use of Actinic Euvl Mask Blank Inspection", Proc. of SPIE, vol. 9256, pp. 92560P-1-92560P-7.

(Continued)

*Primary Examiner* — Hung V Nguyen
(74) *Attorney, Agent, or Firm* — Oliff PLC

(57) ABSTRACT

A substrate defect inspection method includes: irradiating a target substrate with an EUV beam from an EUV illumination source by using a first focusing optical system; guiding a scattered reflected beam, but no specularly-reflected beam, among beams reflected from the target substrate to a light receiving surface of a sensor by using a second focusing optical system; and determining that a defect is present at an irradiation spot of the target substrate with the EUV beam when an intensity of the received scattered reflected beam exceeds a predetermined threshold; the method further including, before the irradiation of the target substrate with the EUV beam: a reflectance acquisition step of acquiring a reflectance of the target substrate to the EUV beam; and a threshold computation step of setting the predetermined threshold based on the reflectance acquired in the reflectance acquisition step.

18 Claims, 7 Drawing Sheets

(56) References Cited

U.S. PATENT DOCUMENTS

| | | | | |
|---|---|---|---|---|
| 9,964,497 B2* | 5/2018 | Fukazawa | ............ | G01N 21/9501 |
| 2010/0271473 A1* | 10/2010 | Aiko | .................. | G01N 21/9501 |
| | | | | 359/708 |
| 2013/0265572 A1* | 10/2013 | Delgado | .................. | G02B 1/11 |
| | | | | 427/523 |

FOREIGN PATENT DOCUMENTS

| | | | |
|---|---|---|---|
| JP | 2012-154902 A | 8/2012 | |
| JP | 2014-153326 A | 8/2014 | |

OTHER PUBLICATIONS

Jan. 28, 2022 Extended Search Report issued in European Patent Application No. 21192285.1.
Barty, A. et al., "Multilayer Defects Nucleated by Substrate Pits: a Comparison of Actinic Inspection and Non-Actinic Inspection Techniques", Proceedings of SPIE, vol. 6349, Jan. 1, 2006, pp. 63492M-1-63492M-9, XP055011268.

\* cited by examiner

[FIG. 1]
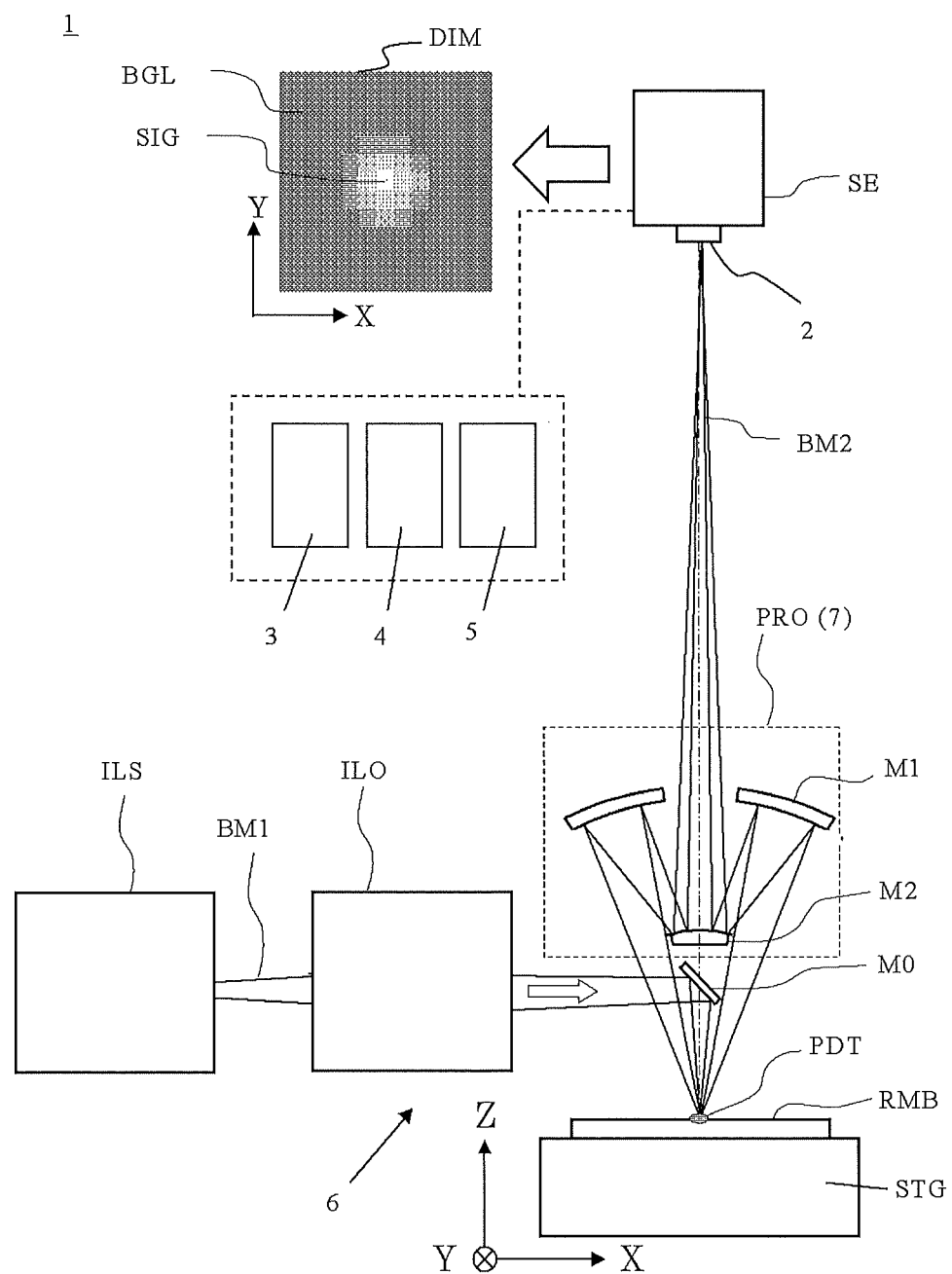

[FIG. 2A]
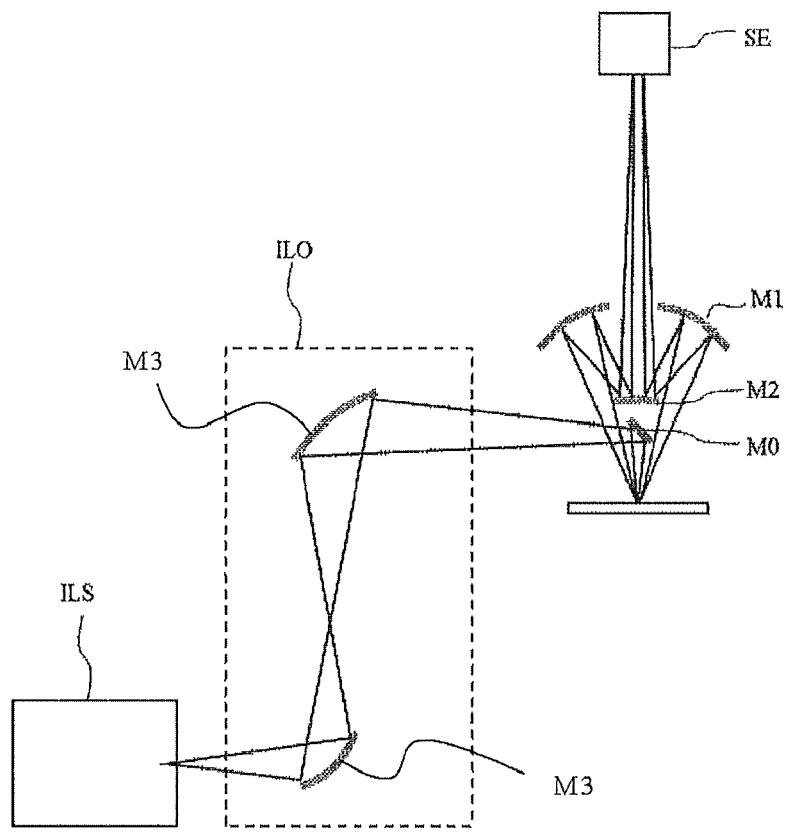
[FIG. 2B]
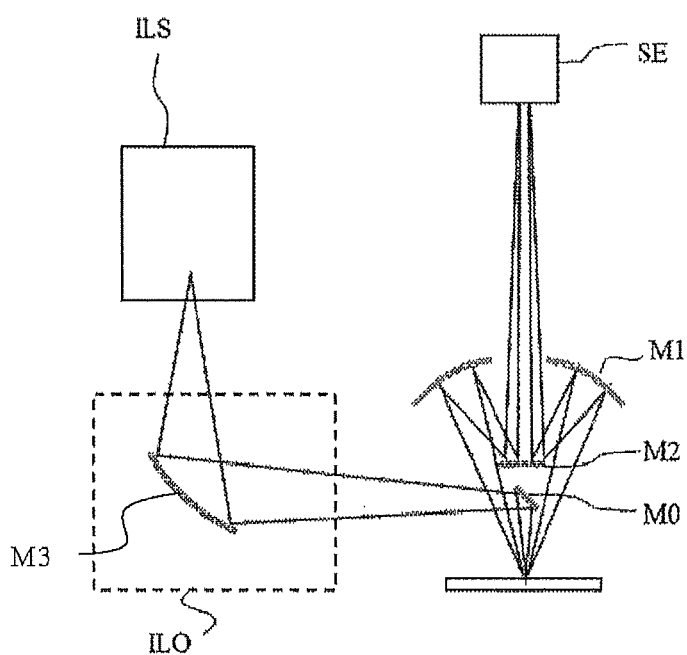

[FIG. 3]
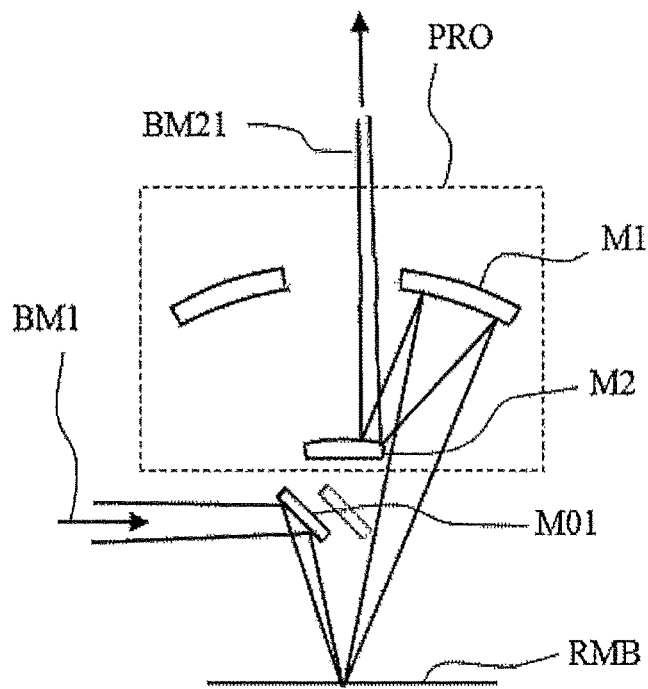
[FIG. 4]
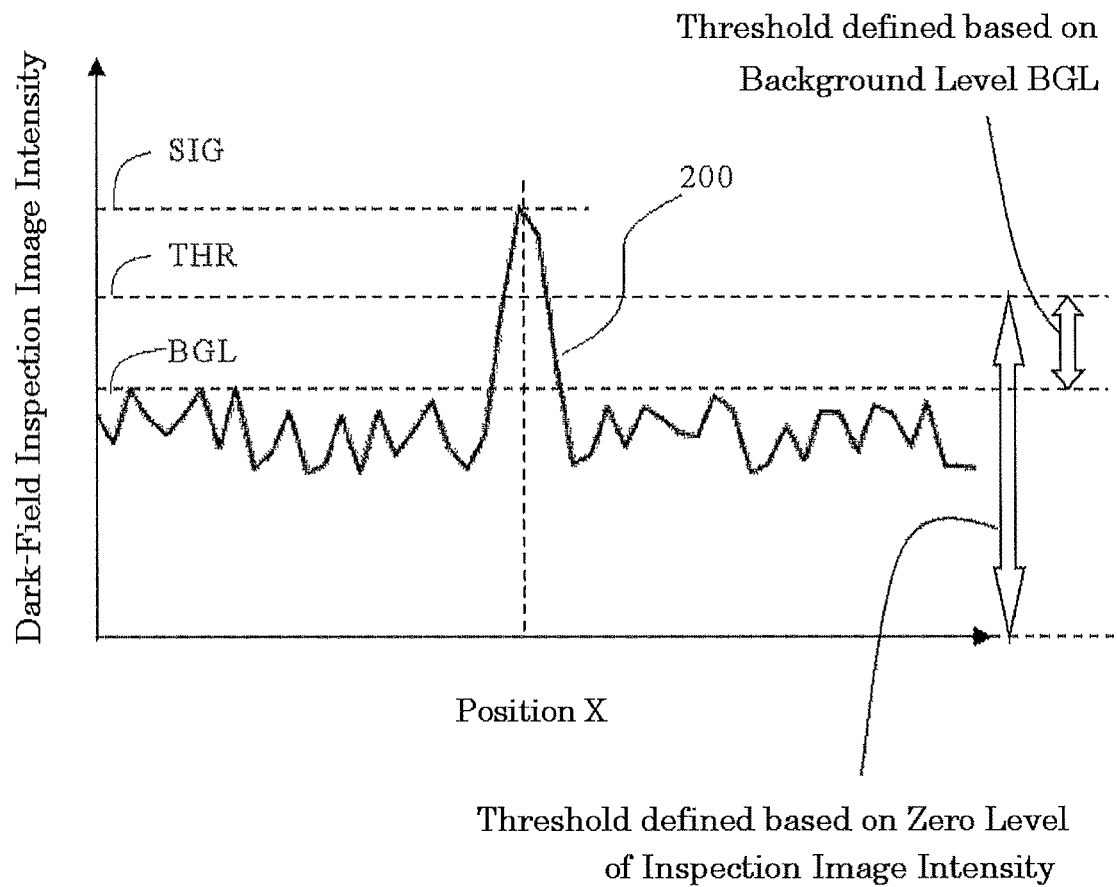

[FIG. 5A]
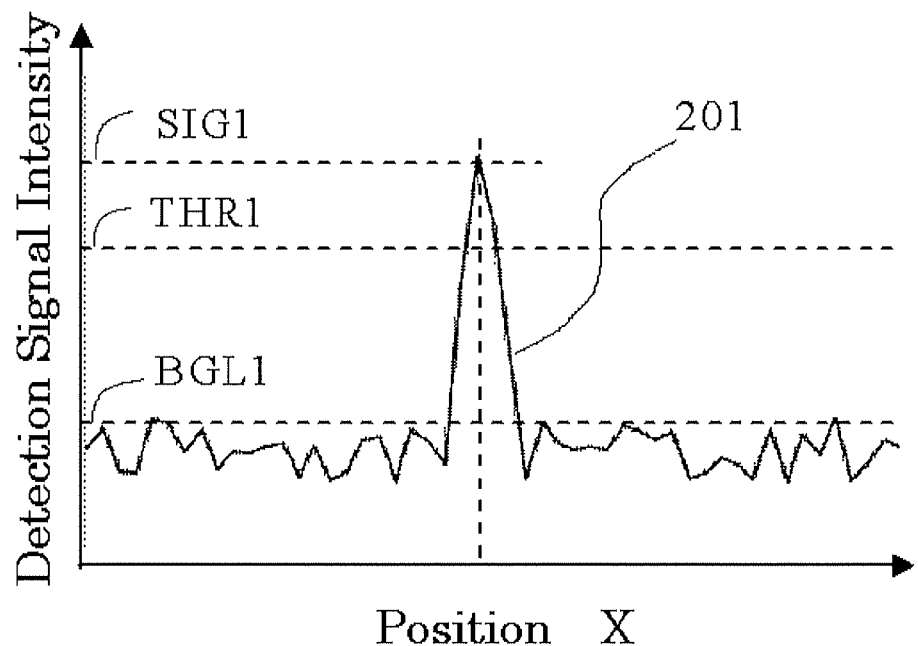
[FIG. 5B]
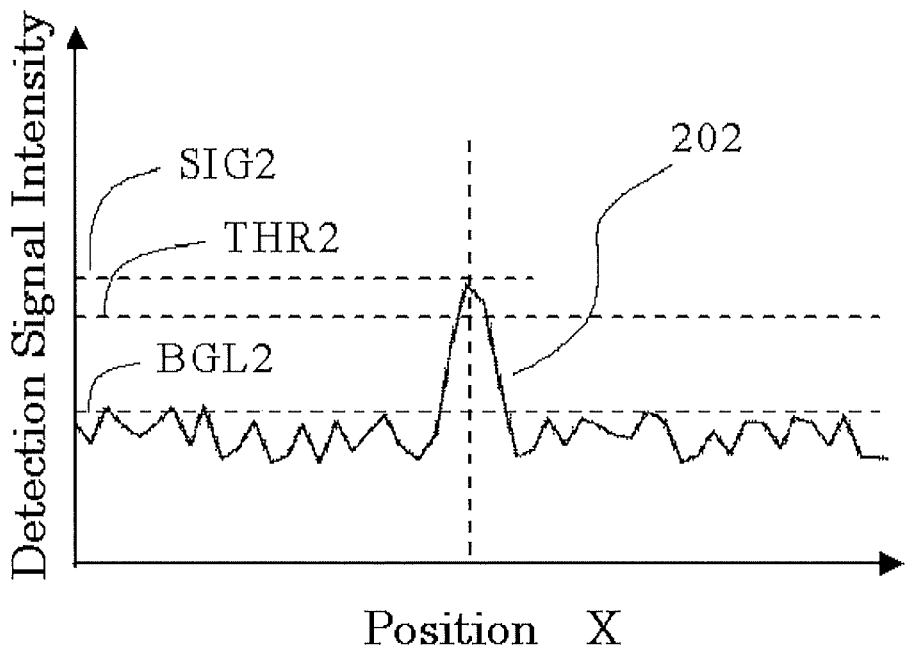

[FIG. 6]
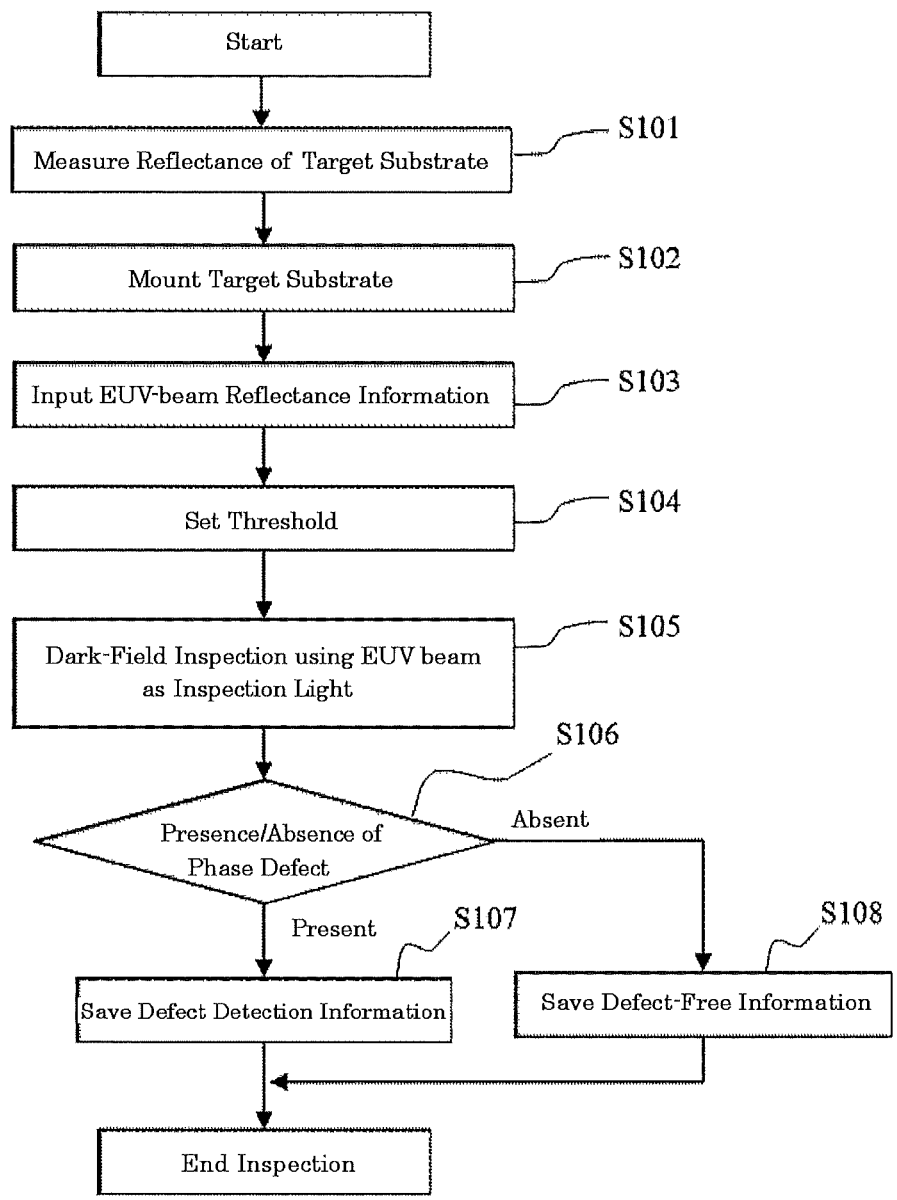

[FIG. 7]
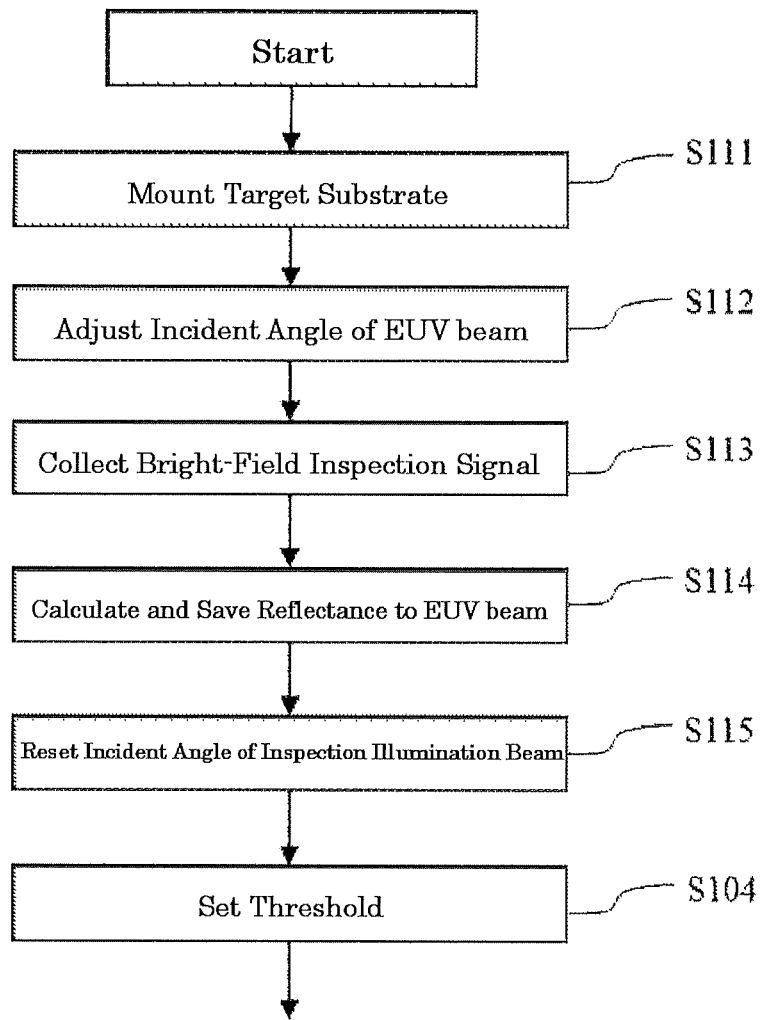
[FIG. 8]
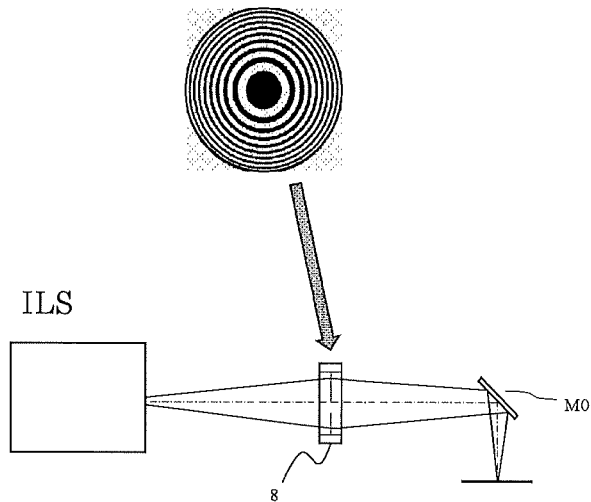

[FIG. 9A]
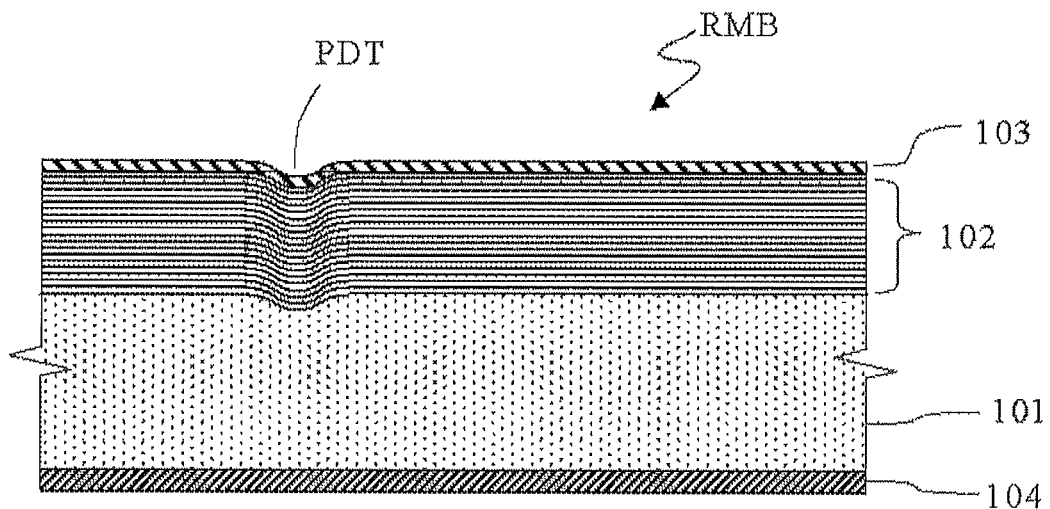
[FIG. 9B]
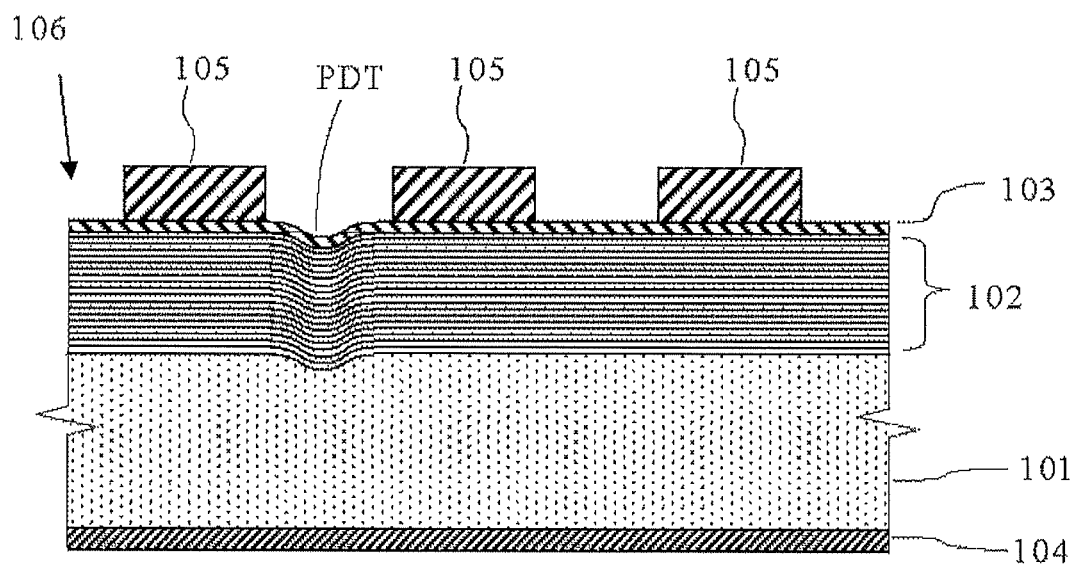

SUBSTRATE DEFECT INSPECTION METHOD AND SUBSTRATE DEFECT INSPECTION APPARATUS

TECHNICAL FIELD

The present invention relates to a defect inspection method and defect inspection apparatus for a substrate, such as mask blanks for manufacturing reflective masks used, for example, in semiconductor device fabrication, etc. Particularly, this invention relates to a substrate-defect inspection method and a substrate-defect inspection apparatus which utilize an extreme ultraviolet (hereinafter, referred to as "EUV") beam having a wavelength of approximately 10 to 20 nm as inspection light.

BACKGROUND ART

In the semiconductor device (semiconductor unit) fabrication process, photolithography technique is repeatedly employed by which a transfer mask is irradiated with exposure light to transfer a circuit pattern formed in the mask onto a semiconductor substrate (semiconductor wafer) through a reduction projection optical system. Conventionally, the wavelength of exposure light has been mainly 193 nm which is achieved by utilizing argon fluoride (ArF) excimer laser beam. Additionally, what is called multi-patterning process that combines exposure process and processing process multiple times has been employed to form a pattern having smaller dimension than the exposure light wavelength in the end.

Nevertheless, since continuous miniaturization of device patterns demands further finer pattern formation, such demands have led to the development of EUV lithography technique that uses, as exposure light, an EUV beam having much shorter wavelength than ArF excimer laser beam. More specifically, EUV beam is a light beam having a wavelength of around 13.5 nm. Since such EUV beam has quite low transparency to materials and this limits the use of conventional transmission-type projection optical system and mask, so that reflection-type optical devices are used. Hence, a reflective mask has also been proposed as a pattern-transferring mask.

In a reflective mask, a multilayer reflective film for reflecting EUV beam is formed on a substrate, and an absorber film for absorbing EUV beam is formed on the multilayer reflective film, the absorber film being subjected to patterning. Meanwhile, a reflective mask with an absorber film not subjected to patterning yet (including a state with a resist layer having been formed) is called "reflective mask blank", from which a reflective mask is formed.

Hereinafter, a reflective mask blank for reflecting EUV beam is also referred to as "EUV mask blank".

An EUV mask blank has a basic structure including: a multilayer reflective film which is formed on a low-thermal-expansion substrate and reflects EUV beam; and an absorber film which is formed on the multilayer reflective film and absorbs EUV beam. A commonly-used multilayer reflective film is a Mo/Si multilayer reflective film in which a molybdenum (Mo) film and a silicon (Si) film are alternately stacked to surely exhibit a reflectance against EUV beam. Further, a protection film for protecting the multilayer reflective film is formed. Meanwhile, a material used for the absorber film mainly contains tantalum (Ta) or chromium (Cr), which have relatively large extinction coefficient with respect to EUV beam.

In EUV lithography application, if a multilayer reflective film of a reflective mask has a surface with a height variation of even 1 nm or so, this causes phase shift in the reflected EUV beam, and causes dimensional change or resolution failure in a transferred pattern which is transferred onto a wafer from the absorber film. A height variation in a mask blank, which causes such phase shift, is called "phase defect". It is very difficult to correct a phase defect after an absorber film is patterned. Thus, it is necessary to inspect a mask blank for phase defect before an absorber film is formed.

Phase defect may originate not only simply from uneven surface of a multilayer reflective film but also from the inside of the multilayer reflective film or uneven surface of a low-thermal-expansion substrate. For this reason, sufficient defect detection is not accomplished by a inspection method using typical laser beam as inspection light. Hence, appropriate countermeasure would be what is called at-wavelength inspection method by which phase defect is detected using inspection light having the same wavelength as that of EUV beam used for exposure of a reflective mask. As examples of this method, methods using dark-field inspection image are disclosed in Patent Documents 1, 2, and Non Patent Document 1, for example.

CITATION LIST

Patent Literature

Patent Document 1: JP 2012-154902 A
Patent Document 2: JP 2014-153326 A

Non Patent Literature

Non Patent Document 1: Takeshi Yamane, Yongdae Kim, Noriaki Takagi, Tsuneo Terasawa, Tomohisa Ino, Tomohiro Suzuki, Hiroki Miyai, Kiwamu Takehisa, Haruhiko Kusunose, "Performance in practical use of actinic EUVL mask blank inspection", Proc. of SPIE, Vol. 9256, 92560P.

SUMMARY OF INVENTION

Technical Problem

Generally, dark-field inspection methods including the inspection techniques in Patent Document 1 and Non Patent Document 1 mentioned above have such advantages that the inspection speed can be improved while the defect-detection sensitivity is kept high in comparison with normally bright-field inspection methods. Moreover, since a defect portion in a dark-field inspection image gives higher luminance signal than the surrounding background level, a defect can be recognized at a position where a signal exceeding a predetermined threshold set in advance is obtained; thus, the detection method is also simple. Further, lowering the threshold level can enhance the sensitivity of the phase defect inspection.

However, the threshold setting is carried out in an empirical or experimental way.

In a dark-field inspection method using EUV beam as inspection light, even if no defect is present, inspection signal may be obtained from a certain background level. This is due to surface roughness on the multilayer reflective film. The smaller the roughness, the lower the background level. In this case, high sensitivity detection is possible by lowering the threshold.

However, this background level is expressed by a product obtained by multiplying a factor attributable to surface roughness by reflectance attributable to the structure (e.g., bilayer period) of the multilayer reflective film. Hence, for example, when a signal is obtained from low background level, it is impossible to tell whether the signal is due to small surface roughness or due to low reflectance of the multilayer reflective film.

The level of a luminance signal obtained by detecting a phase defect does not change even when the surface roughness of the multilayer reflective film is decreased. In contrast, when the reflectance of the multilayer reflective film is decreased, the luminance signal level is also decreased. With small surface roughness, a defect can be detected using a pre-set threshold without problem. Detection sensitivity enhancement is expected when the threshold is further lowered. However, if the reflectance is low, no defect may be detected with a pre-set threshold. A defect of the same size cannot be detected if the threshold is not lowered.

As described above, the threshold setting indicative of the detection sensitivity requires information on the reflectance of a multilayer reflective film. Conventional techniques do not explicitly state that the reflectance is also considered in the threshold setting that contributes to dark-field inspection.

The present invention has been made in view of the above problems. An object of the present invention is to provide a substrate-defect inspection method and defect inspection apparatus which appropriately set a threshold indicative of detection sensitivity in a dark-field inspection using a scattered reflected beam from a target substrate, and which enable highly-reliable phase defect inspection.

Solution to Problem

To achieve the object, the present invention provides a substrate defect inspection method comprising steps of:

irradiating a target substrate with an EUV beam emitted from an EUV illumination source by using a first focusing optical system;

guiding a scattered reflected beam, but no specularly-reflected beam, among beams reflected from the target substrate irradiated with the EUV beam to a light receiving surface of a sensor by using a second focusing optical system; and determining that a defect is present at an irradiation spot of the target substrate with the EUV beam when an intensity of the scattered reflected beam received by the light receiving surface of the sensor exceeds a predetermined threshold, wherein the substrate defect inspection method comprises, before the irradiation of the target substrate with the EUV beam:

a reflectance acquisition step of acquiring a reflectance of the target substrate to the EUV beam; and a threshold computation step of setting the predetermined threshold based on the reflectance acquired in the reflectance acquisition step.

According to the inventive substrate defect inspection method as described above, a threshold (hereinafter also referred to as THR) is set based on the reflectance of a target substrate, which influences not only a background level (hereinafter also referred to as BGL) but also a defect-luminance signal level (hereinafter also referred to as SIG) in a dark-field inspection. Thus, the inventive method makes it possible to set a threshold appropriately. This enables highly-reliable phase defect inspection.

In this event, the reflectance acquisition step may be performed as follows:

a configuration of the first focusing optical system or the second focusing optical system is changed, the first focusing optical system is used to irradiate the target substrate with the EUV beam emitted from the EUV illumination source, the second focusing optical system is used to guide the specularly-reflected beam, which is reflected from the target substrate irradiated with the EUV beam, to the light receiving surface of the sensor, and the reflectance is acquired based on an intensity of the specularly-reflected beam received by the light receiving surface.

In this manner, the reflectance of a target substrate can be easily obtained.

Additionally, it is possible that the first focusing optical system has a mirror, and when the configuration of the first focusing optical system is changed, a position and a posture of the mirror are changed.

In this manner, the specularly-reflected beam from a target substrate can be easily guided to the light receiving surface of the sensor by changing the configuration of the first focusing optical system.

Optionally, in the reflectance acquisition step, the reflectance may be acquired using a reflectometer.

In this manner, the reflectance of a target substrate can be easily obtained using a commercially-available reflectometer, for example.

Moreover, the target substrate may be a substrate having a surface provided with a multilayer reflective film configured to reflect the EUV beam.

The inventive defect inspection method can be suitably employed in inspecting a substrate with a multilayer reflective film, for example, a reflective mask blank, etc.

Further, the reflectance may be an average value in a whole inspection region of the target substrate.

Alternatively, it is possible that the target substrate has an inspection region divided into sub-small-regions, the reflectance is acquired as an average value for each of the sub-small-regions, and the predetermined threshold is set for each of the sub-small-regions.

These manners allow the reflectance and the threshold to be appropriately determined in accordance with, for example, the inspection region size of the target substrate, etc.

Furthermore, each of the first focusing optical system and the second focusing optical system may have a plurality of mirrors provided with multilayer reflective films.

In this manner, it is possible to more appropriately irradiate a target substrate with an EUV beam, and guide scattered reflected beam from the target substrate to the light receiving surface of the sensor.

In addition, the present invention provides a substrate defect inspection apparatus comprising:

an EUV illumination source configured to emit an EUV beam;

a first focusing optical system configured to irradiate a target substrate with an EUV beam from the EUV illumination source;

a second focusing optical system configured to guide a scattered reflected beam, but no specularly-reflected beam, among beams reflected from the target substrate irradiated with the EUV beam to a light receiving surface of a sensor;

an arithmetic processor configured to determine that a defect is present at an irradiation spot of the target substrate with the EUV beam when an intensity of the scattered reflected beam received by the light receiving surface of the sensor exceeds a predetermined threshold; and a threshold computer configured to set the predetermined threshold based on a reflectance of the target substrate to the EUV beam.

The inventive substrate defect inspection apparatus as described above is capable of setting a threshold based on the reflectance of a target substrate, which influences not only background level but also defect-luminance signal level in a dark-field inspection. Thus, the apparatus sets the threshold appropriately. Hence, the apparatus is capable of highly-reliable phase defect inspection.

This apparatus may be configured as follows:
the first focusing optical system or the second focusing optical system has an changeable configuration,
the first focusing optical system is capable of irradiating the target substrate with the EUV beam emitted from the EUV illumination source,
the second focusing optical system is capable of guiding the specularly-reflected beam, which is reflected from the target substrate irradiated with the EUV beam, to the light receiving surface of the sensor, and
the substrate defect inspection apparatus comprises a data acquisition unit configured to acquire the reflectance based on an intensity of the specularly-reflected beam received by the light receiving surface.

With such configurations, the reflectance of a target substrate can be easily obtained.

Moreover, it is possible that the first focusing optical system with the changeable configuration has a mirror, and the mirror is changeable in terms of position and posture.

Such a configuration allows the specularly-reflected beam from a target substrate to be easily guided to the light receiving surface of the sensor by changing the configuration of the first focusing optical system.

Further, the target substrate may be a substrate having a surface provided with a multilayer reflective film configured to reflect the EUV beam.

The inventive defect inspection apparatus is suitably usable in inspecting a substrate with a multilayer reflective film, for example, a reflective mask blank, etc.

Each of the first focusing optical system and the second focusing optical system may have a plurality of mirrors provided with multilayer reflective films.

Such configurations make it possible to more appropriately irradiate a target substrate with an EUV beam, and guide scattered reflected beam from the target substrate to the light receiving surface of the sensor.

Advantageous Effects of Invention

The present invention makes it possible to appropriately set a threshold, which is indicative of detection sensitivity in a dark-field inspection, and to thus provide a substrate defect inspection method and defect inspection apparatus which enable highly-reliable phase defect inspection.

BRIEF DESCRIPTION OF DRAWINGS

FIG. 1 is a schematic diagram showing an example of a defect inspection apparatus according to the present invention;

FIG. 2A is a schematic diagram showing an example of an illumination optical system having two mirrors;

FIG. 2B is a schematic diagram showing an example of an illumination optical system having one mirror;

FIG. 3 is a schematic diagram showing an example of an optical system in measuring the reflectance of a target substrate;

FIG. 4 is an explanatory graph showing an example of an inspection-signal intensity distribution obtained by a dark-field inspection apparatus;

FIGS. 5A and 5B are explanatory graphs showing two exemplary inspection-signal intensity distributions obtained by the dark-field inspection apparatus in which substrates have different surface roughnesses (FIG. 5A) or reflectances (FIG. 5B);

FIG. 6 is a flowchart showing an exemplary flow of a substrate defect inspection method according to the present invention;

FIG. 7 is a flowchart showing another exemplary flow of the substrate defect inspection method according to the present invention;

FIG. 8 is a schematic diagram showing another example of the first focusing optical system in the inventive defect inspection apparatus;

FIG. 9A is a principal cross-sectional view of a substrate with multilayer reflective film for manufacturing a reflective mask blank; and FIG. 9B is a principal cross-sectional view of a reflective mask having an absorber pattern.

DESCRIPTION OF EMBODIMENTS

Hereinafter, embodiments of the present invention will be described in more details with reference to the drawings. However, the present invention is not limited thereto.

Before embodiments of a substrate defect inspection apparatus and a substrate defect inspection method according to the present invention are described, an exemplary target substrate (substrate to be inspected) will be described at first. Note that, in the present invention, a target substrate is not particularly limited, as long as it can reflect EUV beam. Here, a substrate with multilayer reflective film will be described, which is capable of reflecting EUV beam and represented by reflective mask blank, as the target substrate.

FIG. 9A is a cross-sectional view showing a principal portion of a substrate RMB with multilayer reflective film for manufacturing a reflective mask blank.

The substrate RMB with multilayer reflective film has: a substrate 101 made of a low-thermal-expansion material and having a sufficiently-flattened surface; a multilayer reflective film 102 for reflecting a EUV beam; and a protection film 103 for the multilayer reflective film 102. The multilayer reflective film 102 and the protection film 103 are formed in this order on a main surface of the substrate 101. Meanwhile, on another main surface, which is on an opposite side (back side) of the substrate 101 to the surface where the multilayer reflective film 102 is formed, an electro-conductive film 104 is formed to electrostatically hold a reflective mask, which is to be described later, on a mask stage of an exposure apparatus. In this drawing, a phase defect PDT to be described later is also shown.

Hereinbelow, examples of the substrate 101 and so forth of the substrate RMB with multilayer reflective film will be further described in detail, but the target substrate of the present invention is not limited to the following configurations.

As the substrate 101, one composed of a low-thermal-expansion material and having a sufficiently-flattened surface is preferably used. For example, the substrate preferably has a thermal expansion coefficient within $\pm 1.0 \times 10^{-8}/°$ C., preferably $\pm 5.0 \times 10^{-9}/°$ C. Moreover, the main surfaces of the substrate have such surface roughness that the RMS value is preferably 0.1 nm or less, particularly preferably 0.05 nm or less. Such surface roughness can be attained, for example, by polishing the substrate.

The multilayer reflective film 102 is a multilayer film including a layer made of a low-refractive-index material and a layer made of a high-refractive-index material, which are alternately stacked. For EUV beams having an exposure wavelength of 13 to 14 nm (normally, wavelength of approximately 13.5 nm), a Mo/Si laminate film or the like is used. In the laminate film, for example, a molybdenum (Mo) layer as the low-refractive-index material and a silicon (Si) layer as the high-refractive-index material are alternately stacked, for example, by approximately 40 cycles (40 layers of each material). The multilayer reflective film normally has a film thickness of approximately 280 to 300 nm.

The protection film 103, which is also called a capping layer, is provided to protect the multilayer reflective film when an absorber pattern is formed thereon or when the absorber pattern is repaired. As the material for the protection film, silicon (Si), ruthenium (Ru), a compound obtained by adding niobium (Nb) or zirconium (Zr) to ruthenium (Ru), or the like can be used. The protection film normally has a film thickness of approximately 2 to 5 nm.

The electro-conductive film 104 for holding the reflective mask on the mask stage of the exposure apparatus normally has a film thickness of approximately 10 to 50 nm, but may be thicker.

The phase defect PDT is a defect present as a concave or convex portion resulting from fine concave or convex portions which have existed on the main surface of the substrate 101. When the multilayer reflective film 102 is formed thereon, these portions remain from the multilayer reflective film 102 to the protection film 103. Even if a fine convex or concave portion is present on the main surface of the substrate 101, the convex or concave shape is gradually flattened by smoothing effect in the process of forming the layers of the multilayer reflective film 102, and such uneven form may eventually disappear from the surfaces of the multilayer reflective film 102 and the protection film 103. However, even in such s case, a minute uneven form present in the multilayer reflective film 102 causes a phase difference in reflected beam to some extent, acting as phase defect that lowers the reflectance. In addition, even when the substrate 101 does not have defect on the main surface, if fine particles or the like are caught during the formation of the multilayer reflective film 102, a film with uneven form may be formed in the subsequent film formation, which also serves as phase defect.

FIG. 9B shows a principal cross section of a reflective mask 106 having an absorber pattern 105 that is obtained by patterning an absorber film for absorbing EUV beam, the absorber film being formed on the substrate RMB with multilayer reflective film and also with the phase defect PDT.

There is no problem when the absorber pattern 105 is formed to cover the phase defect PDT. However, when the phase defect PDT is present and exposed between adjacent portions of the absorber pattern 105 as shown in FIG. 9B, the phase of reflected beam is disturbed, even if the depth of the exposed phase defect PDT is approximately 1 nm, for example. Consequently, the reflectance is lowered, and defect is generated in the pattern projection image. Hence, it is quite important to detect such phase defect before a reflective mask is manufactured.

Next, the inventive substrate defect inspection apparatus for detecting phase defect present in a multilayer reflective film will be described with FIG. 1.

This inspection apparatus 1 has main constituents of: an EUV illumination source (plasma source) ILS configured to emit an EUV beam BM1; a substrate stage STG on which a substrate RMB with multilayer reflective film (hereinafter also referred to as substrate RMB) is mounted as a target substrate; an illumination optical system ILO; a mirror M0; an imaging optical system PRO (with mirrors M1, M2); and a two-dimensional array sensor (image detector, also simply referred to as sensor) SE having a light receiving surface 2. Besides, the inspection apparatus 1 includes, although not shown, normally-incorporated constituents: a memory, a signal processing circuit, a system control computer configured to control operations of the entire apparatus, a data input-output unit, a defect-inspection-image output unit, etc. Further, in the present invention, for example, the system control computer includes an arithmetic processor 3, a threshold computer 4, a data acquisition unit 5, etc., to be described later. Only these units in the computer are illustrated.

The illumination source ILS is optionally provided with a wavelength selection filter, pressure partition means, scattering-particle suppressing means, or the like. The illumination source ILS emits the EUV beam BM1 by means of plasma, for example.

The illumination optical system ILO is configured to guide the EUV beam BM1 from the illumination source ILS to the mirror M0. FIG. 2A and FIG. 2B show examples of the illumination optical system ILO. The illumination optical system ILO may include two mirrors (concave mirrors) M3 as shown in FIG. 2A, or may include one mirror (concave mirror) M3 as shown in FIG. 2B.

The mirror M0 is configured to irradiate the substrate RMB with the EUV beam BM1 from the illumination optical system ILO.

Note that a first focusing optical system 6 in the present invention includes the illumination optical system ILO and the mirror M0.

The imaging optical system PRO is constituted of the mirror (concave mirror) M1 and the mirror (convex mirror) M2, and is, for example, a Schwarzschild optical system constituting a dark-field imaging optical system with a light collecting NA of 0.25, a central shield NA of 0.1, and a magnification of about 30. This imaging optical system PRO corresponds to a second focusing optical system 7 in the present invention. The imaging optical system PRO is capable of guiding at least a scattered reflected beam (BM2), but not a specularly-reflected beam, among beams reflected from the substrate RMB to the sensor SE. The scattered reflected beam(s) BM2 are collected by the mirror M1, reflected to the mirror M2, reflected by the mirror M2 to converge, and then guided to the sensor SE.

Note that, the mirrors M0 to M3 described above are not particularly limited, as long as each mirror is capable of reflecting EUV beam. For example, the mirrors may be provided with multilayer reflective films. Such mirrors are preferable because these are capable of: efficiently reflecting EUV beams; and more appropriately irradiating the substrate RMB with EUV beam, and guiding scattered reflected beams from the substrate RMB to the light receiving surface 2 of the sensor SE.

Moreover, the first, second focusing optical systems 6, 7 may have changeable configurations. Herein, "changeable configuration" means, for example, that any of the mirrors (particularly, the mirror M0) in the first, second focusing optical systems 6, 7 is changed in terms of position and posture (inclination angle). Each mirror may be supported by an arm, actuator, etc., and the position and so forth of the mirror can be desirably controlled by controlling such support member(s). For example, a control mechanism as described in Patent Document 2 can be adopted.

In this respect, FIG. 3 shows an example of a configuration (optical system for performing bright-field inspection) in measuring the reflectance of the substrate RMB as described later after the above-described configuration change from the configuration as shown in FIG. 1 which allows the reception of the scattered reflected beam BM2 (the optical system configuration for performing dark-field inspection). The arrangement of a mirror M01 by changing the position etc. of the mirror M0 allows a specularly-reflected beam (BM21) among reflected beams from the substrate RMB to be collected, converge, and guided to the sensor SE.

The stage STG and the two-dimensional sensor SE are not particularly limited. For example, conventional means can be used if they can appropriately move the mounted substrate RMB, or can appropriately receive beams reflected from the substrate RMB and process image.

Additionally, in the system control computer, the arithmetic processor 3 plays a role in determining that a defect is present at an irradiation spot of the substrate RMB with the EUV beam BM1 when an intensity of the scattered reflected beam BM2 received by the sensor SE exceeds a predetermined threshold.

Moreover, the threshold computer 4 plays a role in setting the threshold based on the reflectance of the substrate RMB. The contents of a computation program for this threshold based on reflectance will be described later.

Further, the data acquisition unit 5 plays a role in acquiring the reflectance based on an intensity of the specularly-reflected beam received by the light receiving surface 2 of the sensor SE. The data acquisition unit 5 utilizes the intensity of the specularly-reflected beam received by the first, second focusing optical systems 6, 7 having changed the configuration(s) as described above. This enables the apparatus to easily acquire the reflectance of the substrate RMB. This configuration is required if the reflectance of the substrate RMB is obtained by using the inventive defect inspection apparatus 1 by itself. Nevertheless, if the reflectance is measured by using, for example, a separate reflectometer, the data acquisition unit 5 can be omitted.

Now, description will be given of a flow of EUV beam in the dark-field inspection configuration.

The substrate RMB with multilayer reflective film to be inspected for the presence or absence of phase defect is mounted on the stage STG, which is movable in three-axial directions of: XY directions relative to the substrate surface; and a Z direction perpendicular thereto. The EUV beam BM1 having a center wavelength of approximately 13.5 nm emitted from the illumination source passes through the illumination optical system ILO and is converted to a convergent beam. Then, the EUV beam BM1 passes through an opening for adjusting the beam size, is reflected by the mirror M0, and enters a predetermined region of the substrate RMB. The position of the substrate RMB is given as positional information on the stage STG which moves with the substrate RMB mounted thereon.

Among reflected beams from the substrate RMB, scattered beams due to phase defect (the scattered reflected beam BM2) are collected by the imaging optical system PRO to form a convergent beam, and focused on the two-dimensional array sensor SE. Specifically, a dark-field inspection image DIM of the substrate RMB is formed by the two-dimensional array sensor SE, and consequently the phase defect PDT remaining in the substrate RMB is detected as a luminance spot SIG in a background level BGL of a defect-free portion in the inspection image. Information, such as the position of the detected phase defect and the intensity of the defect signal, is stored in a predetermined storage unit, and a variety of information can be observed through a pattern monitor or the image output unit.

The predetermined region of the substrate RMB can be inspected, for example, by employing known general methods, such as by operating the two-dimensional array sensor SE in a TDI (time delay and integration) mode in synchronism with the movement of the stage STG with the substrate RMB mounted thereon. Further descriptions of such general inspection methods are omitted herein.

Next, the significance of considering the reflectance and the setting of the threshold based on the reflectance will be described.

FIG. 4 is an explanatory graph of a dark-field inspection image intensity distribution 200 extracted along a line in the X-axial direction containing a phase defect portion from the dark-field inspection image DIM obtained by the two-dimensional array sensor. In comparison with an inspection image intensity (i.e., BGL) around the defect, when a high inspection image intensity (whose intensity level is indicated by SIG) is obtained from the phase defect portion, if the intensity is higher than a threshold THR set in advance, the presence of a defect is recognized. A condition that a defect is detected is SIG>THR. In addition, the lower the THR level, the higher the detection performance for minute phase defects (higher detection sensitivity). Further, a condition of THR>BGL is essential to prevent noise level detection.

Here, the conventional threshold level THR can be set to a level at which, for example, a predetermined detection sensitivity is achieved in inspection of a predetermined substrate having been prepared to incorporate phase defects with different sizes in advance. Alternatively, the threshold can be set to a level obtained by collecting dark-field inspection signals from various substrates with multilayer reflective films, and then adding a predetermined value to the background level.

The threshold in an inspection apparatus is provided by the inspection apparatus maker. For example, the threshold value is presumably determined through experiments so that a defect of predetermined size could be detected with a predetermined detection probability when a reference substrate with multilayer reflective film (specifically, a substrate with multilayer reflective film for EUV mask blank) is inspected. In this event, the actual reflectance is about 65% to 67%, which has never been considered as a variable conventionally. In other words, in conventional threshold calculations, a predetermined reflectance is presumed, which is based on the aforementioned reference sample, but no consideration has been given to the other reflectances, particularly the reflectances of actually-inspected target substrates.

Incidentally, the background level BGL obtained by a dark-field inspection varies depending on the surface roughness and the reflectance of the multilayer reflective film of the substrate RMB. The higher the reflectance, the higher the background level BGL; the smaller the surface roughness, the lower the background level BGL. With small surface roughness, the difference between the background level BGL and the inspection-image intensity level SIG obtained from a phase defect portion is increased, so that the phase defect can be detected clearly. Thus, higher sensitivity inspection is possible with lower BGL. FIG. 5A shows this state. Here, in a dark-field inspection image intensity distribution 201, an inspection-image intensity level SIG1 obtained from a phase defect portion is the same as SIG shown in FIG. 4, and a threshold level THR1 is also the same as THR shown in FIG. 4. Only a background level BGL1 is lower than BGL shown in FIG. 4.

Nonetheless, for example, when (excessive) heating process increases the thickness of mixing layers and decreases the reflectance of the multilayer reflective film in itself, the background level in a dark-field inspection image intensity distribution 202 is decreased from BGL in FIG. 4 to BGL2 as shown in FIG. 5B, and the inspection-image intensity level obtained from a phase defect portion is also decreased from SIG to SIG2. This SIG2 is lower than THR. Hence, a defect may not be detected with the pre-set threshold level THR. In such a case, normal or equivalent inspection cannot be performed if the threshold level is not lowered to THR2 within a range where no influence is exerted by noise level.

In other words, when the background level BGL of a dark-field inspection image varies, it is necessary to distinguish between whether the surface roughness caused the variation and whether the reflectance per se of the multilayer reflective film caused the variation. Thus, the distinction is made by additionally inputting information on the reflectance, and an appropriate threshold can be set eventually. Consequently, highly-reliable phase defect inspection is satisfactorily performed.

The reflectance can be acquired as a value separately obtained with a normal reflectometer (reflectance meter) as described above, or by adopting a simulation predicted value if the structure of the multilayer reflective film is found. Alternatively, the reflectance can be a value converted from an inspection image intensity obtained by the two-dimensional array sensor SE in the state allowing bright-field inspection (i.e., the state of FIG. 3) where the mirror M0 is variable in terms of position and inclination angle in the inspection optical system shown in FIG. 1.

Hereinbelow, further details of the reflectance and the threshold will be described.

The reflectance of a multilayer reflective film of a substrate RMB discussed here is determined by the combination of alternately-stacked film thicknesses of two types of materials (e.g., Mo and Si) having different refractive indexes. If the laminate structure including mixing layers has no variation and has completely flat surface, a theoretical reflectance $R_0$ is given.

However, in reality, since the substrate surface on which a multilayer reflective film is formed is slightly uneven (has surface roughness), the unevenness remains on the surface of the multilayer reflective film, too, so that the reflected beam slightly scatters. As a result, the amount of beams reflected in the mirror-reflection direction is decreased. When the reflected beams are actually captured by the sensor, the reflectance thus acquired can be shown by the following formula (1).

$$\text{Reflectance} = R_0 \exp\left\{-\left(\frac{4\pi\sigma_{rms}}{\lambda}\right)^2\right\} = R_0\left\{1 - \left(\frac{4\pi\sigma_{rms}}{\lambda}\right)^2\right\} \quad \text{formula (1)}$$

Here, $R_0$ represents the aforementioned theoretical reflectance determined from a laminate structure, $\sigma_{rms}$ represents surface roughness (roughness) (standard deviation), and A represents a wavelength of illumination beam (EUV beam).

A normal substrate for EUV mask has $\sigma_{rms}$ of 0.08 nm or less. Hence, the value in the braces { } on the right side of the formula (1) is approximately 0.994.

The reflectance considered in setting the threshold in the present invention is not the theoretical reflectance $R_0$, but means a reflectance shown by the formula (1) and can be expressed as effective reflectance.

Note that this effective reflectance (measured reflectance) can be defined as in the following formula (2), where $I_0$ represents the amount of illumination light beams collected by a sensor arranged at a position of a substrate whose reflectance is to be measured, and $I_1$ represents the amount of reflected beams (specularly-reflected beams) collected by a sensor arranged in a direction (position) in which the beams are mirror-reflected from the substrate.

$$(I_1/I_0) \times 100(\%) \quad \text{formula (2)}$$

Note that, in the measurement with the optical system configuration as shown in FIG. 3, $I_1$ may be simply the amount of specularly-reflected beams received by a sensor (intensity of the received beams).

Moreover, the definition of the threshold that serves as a premise of the explanation will be described.

When a phase defect is detected with a dark-field inspection apparatus, a defect-free portion exhibits the background level BGL, whereas a defect portion exhibits the defect signal level SIG as described above. The larger the defect size, the higher the SIG level.

Here, BGL can be shown by the following formula (3) with the theoretical reflectance $R_0$.

$$BGL = R_D \frac{16\pi^2}{\lambda^2} 2\pi \int f \times PSD(f) df \propto R_0 \times (\text{roughness component}) \quad \text{formula (3)}$$

Here, integration range is a range of spatial frequency f that can be collected by an inspection apparatus. PSD(f) is a power spectrum density representing a roughness of a mask blank surface.

Here, it is simply shown by using its notion of "roughness component" as above. The roughness component is normally in a range of 0.2% (=0.002) or less.

Meanwhile, since the defect signal SIG varies widely depending on defect form (size etc.), its notion can be shown by the following formula (4).

$$SIG = BGL + (\text{scattered component due to phase defect}) \propto \quad \text{formula (4)}$$
$$R_0 \times (\text{roughness component}) +$$
$$R_0 \times (\text{phase defect size component})$$

In this manner, the second term on the right side of the formula (4) is a product obtained by multiplying the theoretical reflectance $R_0$ by the component attributable to the defect size.

Incidentally, "threshold" is a signal level for distinguishing between acceptable phase defect (generally small defect) and unacceptable phase defect. In FIG. 4, the threshold is represented by THR, and the value is higher than BGL but lower than the signal component SIG of a phase defect having unacceptable size. When SIG exceeds THR, the signal is detected as a phase defect.

Although the threshold THR is defined as a value based on zero level, the value may be based on the background level BGL and may be defined by a difference therefrom. In this case, if SIG in the formula (4) satisfies "SIG≤BGL+threshold", SIG represents an acceptable defect and may not be detected. If "SIG>BGL+threshold" is satisfied, SIG represents a defect that should be detected.

These can be expressed as follows in comparison to the formula (4).

$$\text{Threshold} = R_0 \times (\text{component of acceptable largest defect}) \quad \text{formula (5)}$$

According to the formula (5), the threshold is a product obtained by multiplying the theoretical reflectance $R_0$ by the component attributable to acceptable defect size. For example, $R_0$ is approximately 67% to 69% in normal EUV mask blanks. If this value is invariable, the threshold depends only on defect size. Nevertheless, when $R_0$ is changed, it is necessary to find the changed value.

In this respect, the present invention adopts a value of not the theoretical reflectance $R_0$ but the reflectance (effective reflectance) in the formula (1) as described above. Hence, the value of the threshold set by taking reflectance into consideration according to the present invention is obtained by multiplying $R_0'/R_0$ and a pre-set threshold (i.e., threshold based on a predetermined reflectance provided (recommended) by an inspection apparatus maker as mentioned above), where $R_0'$ represents the effective reflectance.

Note that, when the threshold is defined as a value based on zero level but not difference from the background level BGL as described above, this threshold value is obtained by adding BGL to a set value of the threshold defined by difference from the background level BGL.

Meanwhile, in the threshold calculation through multiplication of $R_0'/R_0$, the theoretical reflectance $R_0$ per se can be calculated solely on the basis of the structure of a target substrate according to a known calculation method. Specifically, the reflectance can be calculated by designating: optical constants (complex indexes of refraction) of individual materials constituting the multilayer reflective film and a film thickness thereof; optical constant of the substrate for forming the multilayer reflective film; and incident angle of EUV beam (angle to the normal line to the surface of the multilayer reflective film). The theoretical reflectance $R_0$ may be obtained for each target substrate by such calculation. However, it is not limited to this manner. The threshold can also be calculated easily through the multiplication of $R_0'/R_0$ by substituting the theoretical reflectance $R_0$ for 66% (in this case, $R_0'/(66\%)$), for example.

Moreover, when BGL is added as described above to define the threshold by a value based on zero level from the threshold defined by difference from the background level BGL, the BGL per se can be obtained from the formula (3) (note that, in the formula, $R_0'$ is substituted for $R_0$). Besides, before a final value (threshold+BGL) is set, a preliminary inspection may be performed with the inspection apparatus in order to obtain BGL in itself, and an inspection signal of portion other than defect may be obtained from a target substrate to thus determine BGL.

Regarding the aforementioned conventional threshold set in advance by an inspection apparatus maker, first of all, since effective reflectance=$0.994 \times R_0$ or more as measured according to the formula (1), this essentially means (effective reflectance)≈$R_0$. Based on the assumption of, for example, (effective reflectance)≈$R_0$=66%, thresholds (defined by difference from BGL) have been experimentally determined in consideration of detection sensitivity, and inspection apparatus makers have recommended such thresholds. In contrast, in the present invention, a threshold is set based on effective reflectance as has been described repeatedly. As an example, the value can be obtained by multiplying a threshold recommended by an inspection apparatus maker by $R_0'/R_0$ ($R_0'/(66\%)$).

Note that the threshold can be set according to a value of the effective reflectance obtained by the measurements, and it is a matter of course that the pre-set threshold can be used without any modification depending on the value of the effective reflectance. For example, when a numerical range of the effective reflectance is 66±0.5%, the threshold of the pre-set value can be set.

Hereinabove, the definitions and calculations of the reflectance and the threshold have been described in details. The data acquisition unit 5 and the threshold computer 4 in the system control computer are capable of reflectance measurement and threshold calculation and setting with a program using, for example, formulae as described above.

Such a defect inspection apparatus as described above is capable of setting a threshold based on the reflectance of a target substrate in a dark-field inspection. Thus, the apparatus sets an appropriate threshold and enables highly-reliable phase defect inspection.

By the way, the first, second focusing optical systems 6, 7 including multiple mirrors have been described as examples. Alternatively, each of the first, second focusing optical systems 6, 7 can also have a configuration that adopts a zone plate instead of some mirror. FIG. 8 shows an example of such a configuration. In the first focusing optical system, a zone plate 8 is disposed in place of the illumination optical system ILO using one or more mirrors. This zone plate 8 may be such that concentric patterns having different pitches depending on the radii are formed from an absorbent material on a substrate having a relatively high transmittance (almost transparency) with respect to EUV beam, for example, a Si-based thin film. The zone plate 8 may have a function of a convex lens having a transmittance of approximately 10%.

Next, description will be given of the inventive substrate defect inspection method using the inventive defect inspection apparatus 1 in FIG. 1.

Embodiment 1

FIG. 6 shows an exemplary flow of the phase defect inspection. First, in Step S101 (reflectance acquisition step), the reflectance of a target substrate RMB is measured. Incidentally, the measurement may be conducted using a substrate prepared by the same process for a target substrate subjected to a dark-field inspection in S105 to be described later. This measurement may adopt, for example, a value measured with a commercially-available reflectometer, or a simulation predicted value, a value predicted from film formation process, if the accuracy is surely guaranteed.

Next, in Step S102, the target substrate is mounted on the phase defect inspection apparatus. Further, information on the aforementioned measured reflectance is inputted (Step S103). Then, a threshold is set so as to recognize the presence of phase defect by dark-field inspection (a threshold can be obtained and set based on the reflectance by using the threshold computer 4) (Step S104: threshold computation step). Subsequently, in Step S105, the inspection apparatus 1 is used to perform phase defect inspection in a predetermined region of the target substrate. Specifically, the EUV beam BM1 is emitted from the EUV illumination source ILS to irradiate the substrate RMB through the first focusing optical system (the illumination optical system ILO, the mirror M0), and the scattered reflected beam BM2 is received by the light receiving surface of the sensor SE through the second focusing optical system (the mirrors M1, M2). Thereafter, when the intensity of the received scattered reflected beam BM2 exceeds the threshold set in Step S104, the arithmetic processor 3 determines that a phase defect is present. When a phase defect is detected, information such as the position and intensity of the defect signal is stored in a predetermined storage unit. After the phase defect inspection in a predetermined region of the target substrate, it is checked whether or not new defect information related to the target substrate is stored (Step S106). If new information is stored, it is determined that a phase defect is present, and the defect detection information is collectively saved in a predetermined storage (Step S107). Meanwhile, if no new information is stored in Step S106, it is determined that phase defect is absent, and the information about the absence of defect is saved in a predetermined storage (Step S108).

Thus, the phase defect inspection is ended.

Embodiment 2

In Embodiment 1 described above, the description has been given of the case where the reflectance of a substrate with multilayer reflective film, as a target substrate, is measured with a reflectometer. Here, description will be given of a case where the reflectance measurement is performed by a method using the inspection optical system of the defect inspection apparatus 1.

Specifically, the optical system configuration in FIG. 3 is employed in this example. As described above, FIG. 3 is a diagram showing extracted parts of the inspection optical systems for phase defect inspection shown in FIG. 1: part of the first focusing optical system including the mirror M0; and part in the vicinity of the imaging optical system PRO (second focusing optical system) constituted of the mirrors M1 and M2. The symbols shown in this diagram are the same as the corresponding symbols in FIG. 1. In this optical system, the position and posture of the planar mirror M0 are changed and configured such that specularly-reflected beams of EUV beams mirror-reflected from the target substrate RMB are incorporated into the imaging optical system PRO.

In this case, using half of the region of the imaging optical system PRO, the specularly-reflected beams BM21 reflected by the target substrate become convergent light directed to the two-dimensional array sensor. In comparison between FIG. 3 and FIG. 1, the multilayer film mirror is changed from M0 to M01, and the scattered reflected beam BM2 directed to the two-dimensional array sensor is changed to the specularly-reflected beam BM21, but there are no other changes. Basically, the intensities in an inspection image obtained by the two-dimensional array sensor using this bright-field inspection optical system exhibit values proportional to the reflectance of the target substrate. The constant of proportionality can be calibrated through inspection of a substrate with a known reflectance.

The reflectance can be calculated as an average of inspection signals in a predetermined region. Specifically, in collecting bright-field inspection signals, the stage having the target substrate mounted thereon is moved, and the bright-field inspection signals in a desired region of the target substrate are continuously or intermittently collected.

Note that although the mirrors M0 and M01 have different average incident angles, even if the same mirror is used within the scope of this embodiment, the reflectance is not significantly decreased.

FIG. 7 shows a flow of the phase defect inspection using the above optical system. First, in Step S111, a target substrate is mounted on the phase defect inspection apparatus 1. Next, in Step S112, the mirror M0 is moved to the position M01 to adjust the incident angle of EUV beam with which the target substrate is irradiated. Thereby, the bright-field optical system shown in FIG. 3 is constructed. Then, bright-field inspection signals are collected from the target substrate (Step S113). Subsequently, the reflectance of the target substrate with respect to the EUV beam is calculated and saved in a predetermined storage of the inspection apparatus (the data acquisition unit 5) (Step S114: reflectance acquisition step). After the reflectance information collection is ended, the mirror M01 is returned to M0 in Step S115 to reset the incident angle of EUV beam with which the target substrate is irradiated. Thereby, the dark-field inspection optical system is constructed.

Thereafter, the threshold employed in the dark-field inspection is set based on the acquired reflectance (Step S104: threshold computation step). The subsequent flow of phase defect inspection in a predetermined region of the target substrate is the same as the flow described using FIG. 6 in Embodiment 1 (Step S105 and thereafter). Thus, FIG. 7 shows that the threshold is set in Step S104, and the subsequent flow is the same as that in FIG. 6 and omitted.

Note that, regarding the reflectance of the target substrate, for example, an average value in the whole inspection region can be acquired. Nevertheless, the reflectance of a target substrate generally has an in-plane distribution. This distribution is, of course, within a range satisfying the reflectance requirement. In order to more strictly set the threshold for dark-field inspection, reflectance information may be collected from each sub-region of appropriate size within the inspection region, and a threshold may be set for each sub-region. For example, the target substrate may have an inspection region divided into assigned sub-small-regions in advance, an average reflectance is acquired for each of the sub-small-regions, and a corresponding threshold can be set for each sub-small-region. In this case, the sub-small-regions may have different threshold, enabling phase defect inspection with more appropriate detection sensitivity.

As has been described above, when a phase defect on an EUV-beam-reflective target substrate (particularly, substrate with multilayer reflective film) is detected by dark-field inspection using EUV beam as inspection light, the present embodiments make it possible to appropriately set a threshold indicative of detection sensitivity, and thus enable highly-reliable phase defect inspection.

Moreover, since appropriate detection sensitivity is achieved through the threshold setting, it is possible to provide EUV mask blanks and EUV masks including substrates with multilayer reflective film effectively free of defect, which are selected by detecting a phase defect larger than predetermined size, and discarding a substrate with multilayer reflective film containing such defect.

EXAMPLE

Hereinafter, the present invention will be more specifically described with reference to Example. However, the present invention is not limited thereto.

(Example)

The inspection apparatus 1 shown in FIG. 1 was used to perform phase defect inspection according to the inspection method flow shown in FIG. 6. More specifically, the inspection was performed after a threshold was set in consideration of the reflectance of a substrate to be processed.

Here, as the target substrate, a substrate with multilayer reflective film as shown in FIG. 9A was used in which molybdenum (Mo) and silicon (Si) layers were alternately stacked by 40 cycles on a low-thermal-expansion substrate, and a Ru film was further formed on the resultant.

Regarding the surface roughness, the surface of another substrate with multilayer reflective film prepared by the same process as above was measured with an atomic force microscope (AFM). The value of 0.08 nm in terms of rms was obtained, but this was merely used as a reference value. Immediately before phase defect inspection (dark-field inspection) using the inventive inspection apparatus 1 shown in FIG. 1, the preceding substrate with multilayer reflective film was measured for the reflectance with respect to EUV beam. In this measurement, a reflectometer manufactured by EUV-Tech was used to acquire an average value of the reflectance in an inspection region of the target substrate. The value was 66.5% with respect to the incident angle of 6°.

Next, to perform phase defect inspection (dark-field inspection) with the inspection apparatus 1 shown in FIG. 1, the target substrate having been measured for the reflectance was mounted on the stage of the inspection apparatus, the reflectance information was inputted, and then a threshold was set. Thereafter, according to the inspection procedure of the inspection apparatus, the target substrate was inspected for phase defect within the predetermined region.

Here, although the incident angle of the EUV beam was 6° in the reflectance measurement, the incident angle of the chief ray of irradiation light in the dark-field defect inspection apparatus shown in FIG. 1 was 0°. Nevertheless, actual irradiation light is convergent light, and the actual incident angle is in a range of approximately 0±5 degrees. Additionally, how the reflectance of the multilayer reflective film targeted in this Example would change in accordance with the incident angle can be already-known approximately from the bilayer period of the multilayer reflective film. If the reflectance with the incident angle of 6° is found, the reflectance relative to the irradiation angle in the phase defect inspection apparatus can be found. Thus, based on the reflectance information, it is possible to judge whether a pre-set value (conventional threshold recommended by the inspection maker) may be used as the threshold or whether the threshold should be changed. In this case, since the acquired reflectance was within a suitable range, the pre-set value was used as the threshold value without modification.

Next, the same phase defect inspection was performed on several substrates with multilayer reflective films having been subjected to different heat treatments. The heating processes did not greatly change the uneven form or roughness of defect portions on the substrate surfaces, but mixing in the multilayer reflective films proceeded, and the reflectances were decreased to 64.5%. Accordingly, this reflectance measurement result was inputted as described above. Then, the threshold was adjusted (i.e., the conventional threshold recommended by the inspection maker was reset to the value multiplied by $R_0'/R_0$ described above), and the target substrates were inspected for phase defect within the predetermined region. When the background level and so forth were actually evaluated, the resulting decreases corresponded to those shown in FIG. 5B. In other words, the conventionally-set threshold value would have failed to detect the defects. In contrast, the defects were detected successfully by adjusting the threshold based on the reflectances in advance as described above. The present invention effectively worked, and the inspection was possible with further appropriate detection sensitivity.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A substrate defect inspection method comprising steps of:
    irradiating a target substrate with an EUV beam emitted from an EUV illumination source by using a first focusing optical system;
    guiding a scattered reflected beam, but no specularly-reflected beam, among beams reflected from the target substrate irradiated with the EUV beam to a light receiving surface of a sensor by using a second focusing optical system; and
    determining that a defect is present at an irradiation spot of the target substrate with the EUV beam when an intensity of the scattered reflected beam received by the light receiving surface of the sensor exceeds a predetermined threshold,
    wherein the substrate defect inspection method comprises, before the irradiation of the target substrate with the EUV beam:
    a reflectance acquisition step of acquiring a reflectance of the target substrate to the EUV beam; and
    a threshold computation step of setting the predetermined threshold based on the reflectance acquired in the reflectance acquisition step.

2. The substrate defect inspection method according to claim 1, wherein
    in the reflectance acquisition step,
    a configuration of the first focusing optical system or the second focusing optical system is changed,
    the first focusing optical system is used to irradiate the target substrate with the EUV beam emitted from the EUV illumination source,
    the second focusing optical system is used to guide the specularly-reflected beam, which is reflected from the target substrate irradiated with the EUV beam, to the light receiving surface of the sensor, and
    the reflectance is acquired based on an intensity of the specularly-reflected beam received by the light receiving surface.

3. The substrate defect inspection method according to claim 2, wherein
    the first focusing optical system has a mirror, and
    when the configuration of the first focusing optical system is changed, a position and a posture of the mirror are changed.

4. The substrate defect inspection method according to claim 1, wherein in the reflectance acquisition step, the reflectance is acquired using a reflectometer.

5. The substrate defect inspection method according to claim 1, wherein the target substrate is a substrate having a surface provided with a multilayer reflective film configured to reflect the EUV beam.

6. The substrate defect inspection method according to claim 2, wherein the target substrate is a substrate having a surface provided with a multilayer reflective film configured to reflect the EUV beam.

7. The substrate defect inspection method according to claim 3, wherein the target substrate is a substrate having a surface provided with a multilayer reflective film configured to reflect the EUV beam.

8. The substrate defect inspection method according to claim 4, wherein the target substrate is a substrate having a surface provided with a multilayer reflective film configured to reflect the EUV beam.

9. The substrate defect inspection method according to claim 1, wherein the reflectance is an average value in a whole inspection region of the target substrate.

10. The substrate defect inspection method according to claim 1, wherein
the target substrate has an inspection region divided into sub-small-regions,
the reflectance is acquired as an average value for each of the sub-small-regions, and
the predetermined threshold is set for each of the sub-small-regions.

11. The substrate defect inspection method according to claim 1, wherein each of the first focusing optical system and the second focusing optical system has a plurality of mirrors provided with multilayer reflective films.

12. A substrate defect inspection apparatus comprising:
an EUV illumination source configured to emit an EUV beam;
a first focusing optical system configured to irradiate a target substrate with an EUV beam from the EUV illumination source;
a second focusing optical system configured to guide a scattered reflected beam, but no specularly-reflected beam, among beams reflected from the target substrate irradiated with the EUV beam to a light receiving surface of a sensor;
an arithmetic processor configured to determine that a defect is present at an irradiation spot of the target substrate with the EUV beam when an intensity of the scattered reflected beam received by the light receiving surface of the sensor exceeds a predetermined threshold; and
a threshold computer configured to set the predetermined threshold based on a reflectance of the target substrate to the EUV beam.

13. The substrate defect inspection apparatus according to claim 12, wherein
the first focusing optical system or the second focusing optical system has an changeable configuration,
the first focusing optical system is capable of irradiating the target substrate with the EUV beam emitted from the EUV illumination source,
the second focusing optical system is capable of guiding the specularly-reflected beam, which is reflected from the target substrate irradiated with the EUV beam, to the light receiving surface of the sensor, and
the substrate defect inspection apparatus comprises a data acquisition unit configured to acquire the reflectance based on an intensity of the specularly-reflected beam received by the light receiving surface.

14. The substrate defect inspection apparatus according to claim 13, wherein
the first focusing optical system with the changeable configuration has a mirror, and
the mirror is changeable in terms of position and posture.

15. The substrate defect inspection apparatus according to claim 12, wherein the target substrate is a substrate having a surface provided with a multilayer reflective film configured to reflect the EUV beam.

16. The substrate defect inspection apparatus according to claim 13, wherein the target substrate is a substrate having a surface provided with a multilayer reflective film configured to reflect the EUV beam.

17. The substrate defect inspection apparatus according to claim 14, wherein the target substrate is a substrate having a surface provided with a multilayer reflective film configured to reflect the EUV beam.

18. The substrate defect inspection apparatus according to claim 12, wherein each of the first focusing optical system and the second focusing optical system has a plurality of mirrors provided with multilayer reflective films.

* * * * *